United States Patent [19]

Tsuchiya

[11] Patent Number: 4,760,673

[45] Date of Patent: Aug. 2, 1988

[54] LEAD FRAME FINISHING APPARATUS

[75] Inventor: Tomio Tsuchiya, Shizuoka, Japan

[73] Assignee: Fuji Seiki Machine Works, Ltd., Shizuoka, Japan

[21] Appl. No.: 47,839

[22] Filed: May 6, 1987

[30] Foreign Application Priority Data

Jun. 3, 1986 [JP] Japan .............................. 61-83620[U]

[51] Int. Cl.$^4$ ............................................... B24C 3/12
[52] U.S. Cl. ........................................ 51/418; 51/410; 51/415
[58] Field of Search ................. 51/426, 428, 431, 439, 51/415, 418, 410, 319, 166 T, 166 MH, 240 T, 421, 237 R, 237 T, 417, 215 E; 118/315, 323, 324

[56] References Cited

U.S. PATENT DOCUMENTS

| | | | |
|---|---|---|---|
| 2,037,047 | 4/1936 | Rosenberger | 51/439 |
| 4,015,661 | 4/1977 | Christensen | 81/57.18 |
| 4,024,673 | 6/1976 | Collignon | 51/240 T |
| 4,561,219 | 12/1985 | Harada et al. | 51/418 |

FOREIGN PATENT DOCUMENTS

| | | | |
|---|---|---|---|
| 1279551 | 11/1961 | France | 51/319 |
| 2374141 | 8/1978 | France | 51/417 |

OTHER PUBLICATIONS

Copy of English Translation of Japanese Utility Application No. 59-174 376, filed Nov. 19, 1984 and copy of drawings, (2 sheets).

*Primary Examiner*—Frederick R. Schmidt
*Assistant Examiner*—Bradley I. Vaught
*Attorney, Agent, or Firm*—Flynn, Thiel, Boutell & Tanis

[57] ABSTRACT

A lead frame finishing apparatus comprises a tool supporting base on which a plurality of lead frame finishing tools are provided. Two frames support a lead frame transfer unit which clamps the lead frames at their edges and has an adjustable. A linkage unit connects one of the frames to the tool supporting base and pivots the tool supporting base around a pin to correspond the effective width covered by the tools to the width between the two frames which support the lead frame transfer unit.

12 Claims, 3 Drawing Sheets

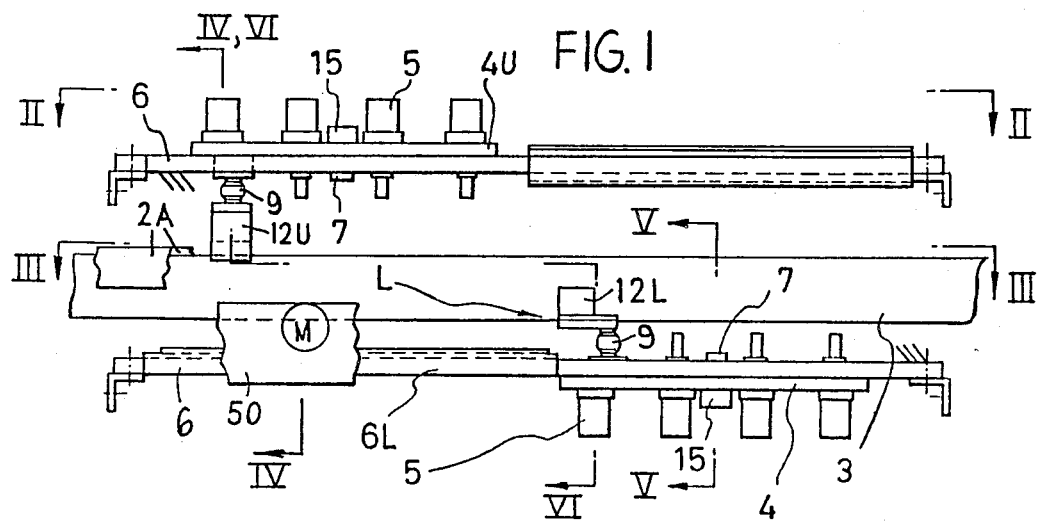
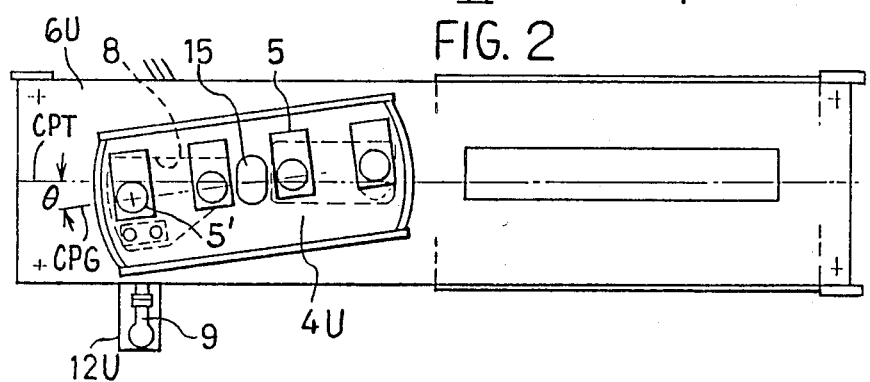
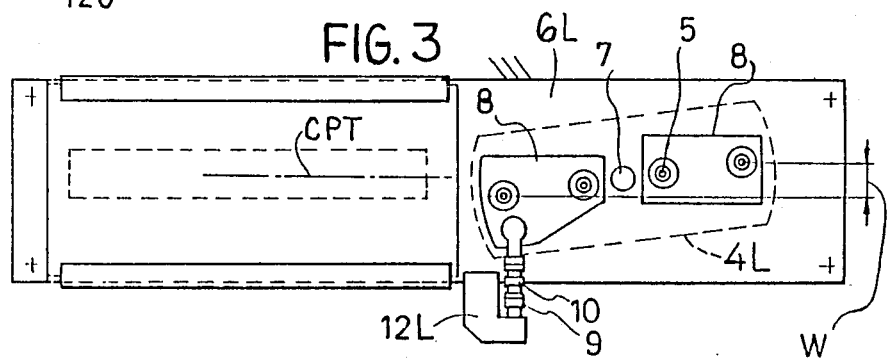

LEAD FRAME FINISHING APPARATUS

FIELD OF THE INVENTION

This invention relates to a lead frame finishing apparatus, in which the effective width of finishing varies automatically consistent with width of the lead frame being transferred through the apparatus.

BACKGROUND OF THE INVENTION

Generally, when an electronic device on a lead frame is packaged in synthetic resin by a molding process, some resin bleed or flash is left on the leads of the lead frame. This bleed or flash must be removed. Such is done with a suitable tool in a finishing operation. When the finishing tool (typically a slurry blasting gun) for finishing the lead frame is fixed, the width to be finished by the tool cannot be varied to correspond to different width lead frames to be transferred past the tool. This is one shortcoming of a fixed tool.

To avoid this shortcoming, Laid-Open Japanese Utility application No. 59-174 376 proposed a lead frame finishing apparatus which provided a pivotable base plate carrying a plurality of such finishing tools (blasting guns), which base plate was pivoted by a train of gears and a gear driving motor to change the width of the blasting area. A pair of base plates (each with its own finishing tools, gear train and motor) was provided, one above and the other below the lead frame to be finished.

The latter lead frame finishing apparatus needed a pair of motor-gear train units to pivot the two base plates and the apparatus was thus expensive. When the width of the lead frame to be finished was changed, the finishing width of the apparatus had to be changed every time by driving the two gear trains and by adjusting thereof to make equal the effective blasting widths of the upper and lower pluralities of blasting guns. This operation and the down time required by this operation was one defect of this prior apparatus. Also, error in adjusting the new set-up sometimes occured and this degraded quality control.

The objects of the present invention include providing an apparatus which is to overcome the defects in the above discussed prior apparatus, in which two frames can move to vary their effective width in response to change of width of the transferred lead frames, in which the finishing area of the finishing tools are automatically adjusted relative to changed lead frame width, in which a separate power source to adjust effective width of the finishing tool is not necessary, and which combines the above mentioned benefits with operational efficiency.

SUMMARY OF THE INVENTION

The objects and purposes of this invention are met by providing a lead finishing apparatus comprising a tool supporting base (for example, a blasting gun supporting base) on which a plurality of lead frame finishing tools are provided; two frames which support a lead frame transfer means, which in turn clamps opposite edges of the lead frames for transferring same, the width between the two frames being adjustable; and a linkage which connects one of the frames to a given tool supporting base and pivots the tool supporting base in response to varying of the width between the two frames which support the transfer means.

In the inventive lead frame finishing apparatus, the frames move to open or close width therebetween corresponding to a change of width of the lead frames being transferred. When the width between the two frames is adjusted, the tool supporting base (which can pivot freely in a plane parallel to the lead frame surface to be cleaned) is pivoted by the motion of the linkage connecting one of said frames and the said pivoting base, such that the effective width cleaned by the finishing tools is adjusted to correspond to the change of the lead frame width.

BRIEF DESCRIPTION OF THE DRAWINGS

FIG. 1 is a fragmentary front view of a lead frame finishing apparatus embodying this invention.

FIG. 2 is a plan view in accord with line II—II in FIG. 1.

FIG. 3 is a cross-sectional view substantially taken on the line III—III of FIG. 1 and omitting the transfer means and frames supporting same to more clearly show the lower tool supporting base.

DETAILED DESCRIPTION

Figure 6:
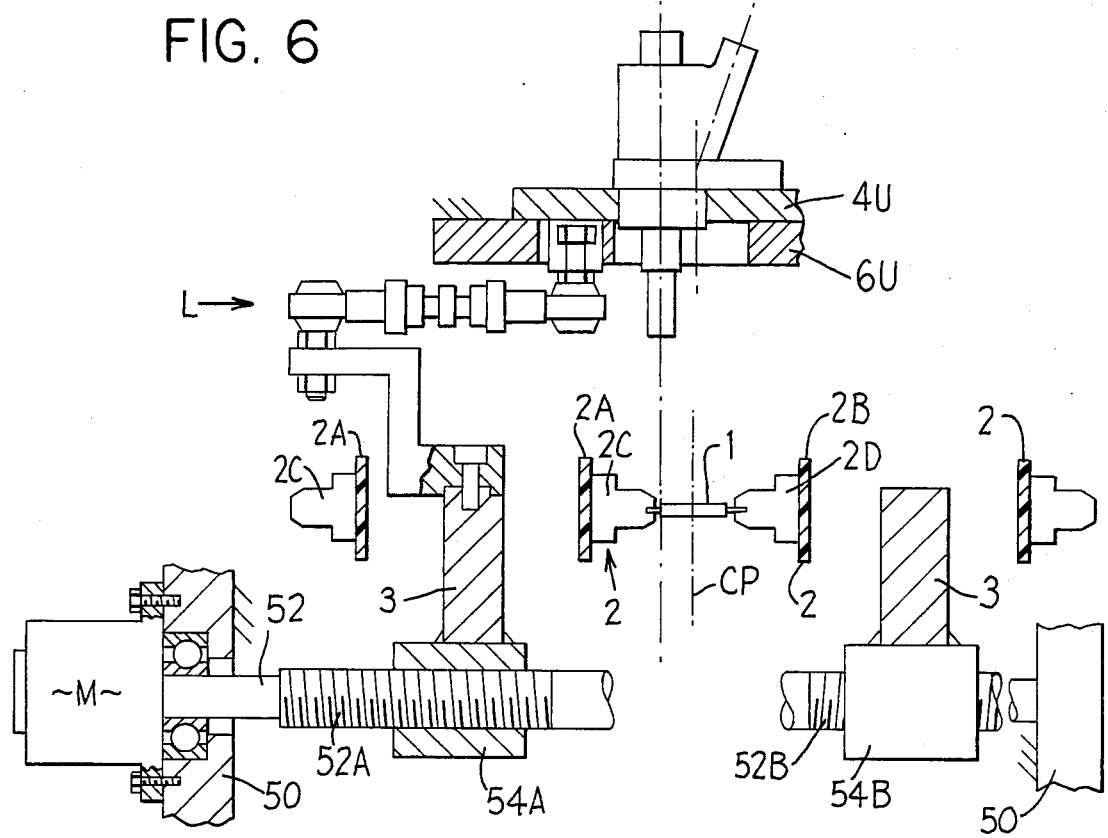
FIG. 6 is a fragmentary sectional view taken on the line VI—VI of FIG. 1.

Turning now to the drawings, a lead frame finishing apparatus embodying the invention includes a fixed main frame 50 (FIGS. 1 and 6). The main frame 50 extends along a path along which lead frames 1 are successively transferred (conveyed), namely from right to left in FIGS. 1-3 and 7.

Figure 4:
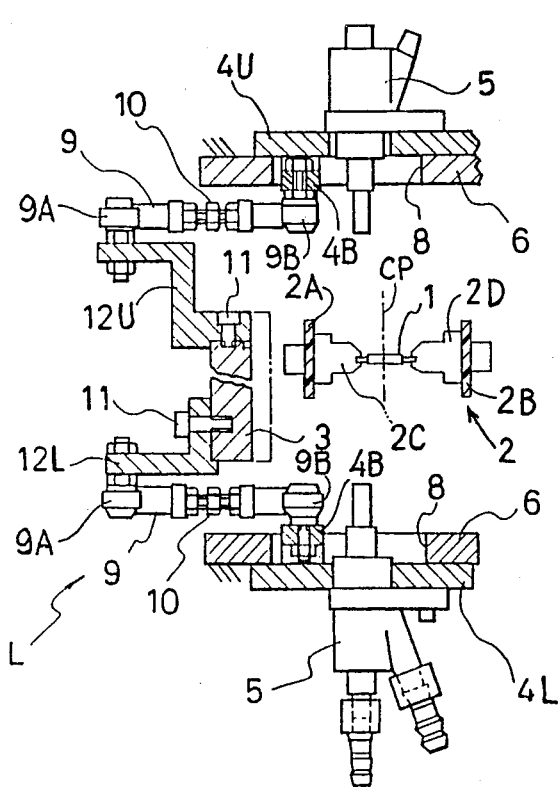
FIG. 4 is a fragmentary sectional view taken on the line IV—IV of FIG. 1.

In FIGS. 4 and 6, a lead frame 1 to be transferred is shown. The opposite edges of the lead frame 1 are clamped to and transferred by transfer means 2. The transfer means 2 comprises, for example, a transfer belt conveyor which comprises two endless timing belts 2A and 2B carrying clamps 2C and 2D between which are clamped a series of the lead frames 1. Two frames 3 orbitally support the respective endless belts 2A and 2B of the transfer means 2, which endless belts extend to the ends of the respective frames 3, and are laterally opposed to each other. The two lead frames 3 and the corresponding endless belts 2A and 2B supported thereon, extend the length of the path of the lead frames 1 through the apparatus. Use of such a pair of laterally opposed endless belts to advance lead frames along a transfer path is shown at 57 in FIG. 8 of U.S. Pat. No. 4,555,876 assigned to the assignee of the present invention. In the present application, the two frames 3 are supported by any convenient means for movement toward and away from each other on the main frame 50. The width between the two frames 3, 3 can be freely adjusted to fit the width between the two frames to accord with the width of the lead frames 1 to be transferred.

Figure 7:
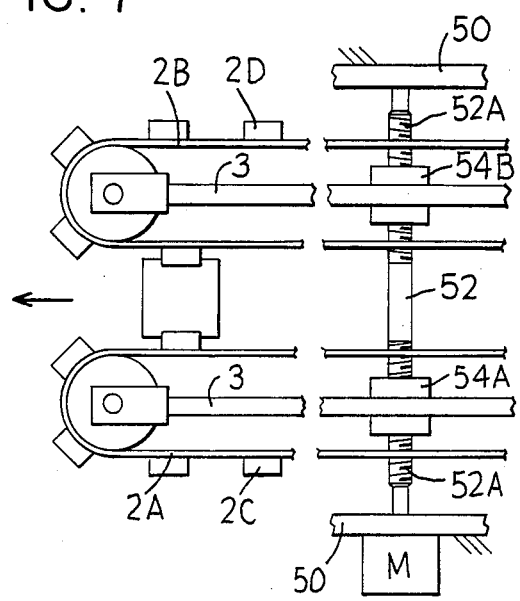
FIG. 7 is a fragmentary sectional view taken substantially on the line III—III of FIG. 1 to show details of the transfer means, and for clarity omitting the lower base plate and structure thereon.

FIGS. 1, 6 and 7 illustrate preferred means for moving the frames 3, 3 toward and away from each other to set the transfer means 2 for different width lead frames 1. A motor M fixed to the main frame 50 is actuable to rotate an elongate shaft 52 rotatably supported on the main frame 50. The shaft 52 has opposite hand threaded portions 52A and 52B respectively threadedly engaging nuts 54A and 54B. The left and right frames 3, 3 are respectively fixed on the nuts 54A and 54B. Thus, oppositely directed rotation of the motor driven shaft 52 shifts the frames 3, 3 toward and away from the central plane CPT of the transfer means 2.

Upper and lower rectangular tool supporting bases 4U and 4L (FIG. 4) each carry a plurality of finishing tools, here four symmetrically spaced blasting guns 5, to finish the lead frames 1. An upper base plate 6U is fixed to the main frame 50 above the lead frame transfer means 2, and a lower base plate 6L is fixed to the main frame 50 beneath the lead frame transfer means 2. The tool supporting bases 4U and 4L lie respectively above and below their respective base plates 6U and 6L. The tool supporting bases 4U and 4L are symmetrically pivoted on the respective base plates 6U and 6L by centrally located, vertical axis pivots 7, such that each tool supporting base 4U and 4L can be pivoted horizontally on its respective base plate 6U and 6L. The pivots 7 are centered on the longitudinal central plane CPT of the transfer means 2.

Each base plate 6U, 6L has open windows 8 through it. These windows 8 receive therethrough the output tips of the blasting guns 5 on the corresponding tool supporting base 4U, 4L and allow the latter to pivot by allowing the guns to move arcuately within the space of the corresponding windows 8. As shown in FIGS. 1-3, the blasting guns 5 are fixed on the outside face of the tool supporting bases 4U, 4L and inwardly project through the windows 8 in the base plates 6U, 6L toward the lead frames 1 to be cleaned. The upper base plate 6U (carrying the upper tool supporting base 4U) is fixed to the main frame 50 at a location offset along the transfer path of the lead frames 1 from the location of the lower base plate 6L (and lower tool supporting base 4L) to avoid interference due to blasting by two opposing blasting streams. Otherwise, if the upper and lower blasting guns 5 were opposed to each other, their blasting streams would meet together at the lead frame transfer path.

The inventive apparatus includes linkage means L (FIG. 4) for changing the effective blasting width of the blasting guns 5 to correspond to a change in the width of lead frames 1 to be finished. Such linkage means L comprises upper and lower support arms 12U and 12L fixed by bolts 11 to one of the frames 3 and extending outboard therefrom. The free end of each support arm 12U and 12L pivotally supports at one end 9A of a horizontal link 9. The link 9 is adjustable in length, here by incorporating a turnbuckle 10 in the middle thereof. The other end 9B of the link 9 is pivotally connected to a bracket 4B fixed to the lead frame facing surface of the corresponding pivotable tool supporting base 4U, 4L, near the end of such tool supporting base. Each bracket 4B projects loosely through the corresponding window 8 in the corresponding base plate 6U, 6L into the zone between the base plates occupied by the links 9, supporting arms 12U, 12L, frames 3, and transfer means 2.

When the two frames 3, 3 approach or separate from one another, the linkage means L correspondingly pivots the tool supporting bases 4U and 4L around their pins 7.

Figure 5:
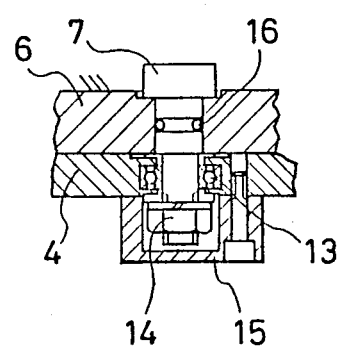
FIG. 5 is a fragmentary sectional view taken on the line V—V of FIG. 1.

As seen in FIG. 5, each pin 7 extends through the corresponding base plate 6 and pivotally mounts the corresponding tool supporting base 4 by means of a low friction bearing 13, e.g. a ball or roller bearing, to make it easy for the tool supporting base 4U, 4L to pivot around the pin 7. A cap 15 covers a nut 14 which axially fixes the pivot pin 7. An O-ring 16 on the shank of the pin 7, and cap 15, together prevent penetration of water or abrasive particles into the bearing 13.

In accord with the present invention, the angle $\theta$ is to be kept small, namely so that $\theta$ approximates Tan $\theta$. Accordingly, the angle $\theta$ is preferably kept at less than 6°. Failure to adhere to this constraint may render cleaning uneven across the width of the lead frame being cleaned. As an example of the adjustability of the apparatus to different lead frame widths, assume that the lead frame width changes from 32 mm to 42 mm. Assume further that the radius from the pivot axis of pivot pin 7 to the vertical central axis of the left most gun 5' (FIG. 2) is 200 mm. To accomodate the mentioned lead frame width change, the central vertical axis of the left most gun 5' would pivot from 16 mm of the central plane CPT to 21 mm off the central plane CPT. In this example, the angle $\theta$ varies from about $4\frac{1}{2}$° to 6° and coverage of the lead frames by the blasting guns 5 remains uniform.

OPERATION

In the lead frame finishing apparatus embodying this invention, when the width of the lead frames 1 is to be changed, the motor M is actuated to rotate the threaded shaft 52 in the appropriate direction to cause the frames 3, 3 to laterally move toward or away from each other, such that the width of the lead frame carrying conveyor (transfer means) 2 is caused to fit the width of the new lead frames 1 to be cleaned. Such lateral movement of the frames 3, and more particularly the left frame 3 in FIG. 4, laterally moves with it the supporting arms 12U, 12L and the links 9 and therewith pivots the tool supporting bases 4U and 4L in a direction to increase or reduce the angle $\theta$ (FIG. 2) between the central plane CPT of the transfer means 2 and the central plane CPG of the guns 5. Thus, the effective finishing width W (FIG. 3) of the finishing tools 5 on the tool supporting bases 4U, 4L automatically is changed in accord with the change in the width of the lead frames 1 to be transferred.

In this example, the linkage means L comprises the link 9 incorporating the turnbuckle 10. The finishing width of the blasting guns 5 can be adjusted to match the width of the lead frames 1. Indeed, adjustment of the blasting width is automatically performed by actuating the motor M to fit the width between belts 2A and 2B to the new width of lead frames 1 without any separate manual comparison of the angle $\theta$ to the lead frame width. This is one favorable feature of this device.

In this example, a plurality of the identical finishing tools 5 are provided on each tool supporting base 4, but other kinds of finishing tools are contemplated. In this example, each tool supporting base 4 pivots at its center, but it is contemplated that the pivot can be located at the other end of the base 4 from the bracket 4B. The link motion is not limited to the design shown in this example, but link motion can instead be designed otherwise. The disclosed embodiment however is preferred.

This invention offers an apparatus which can adjust the width of finishing to fit changes in the width of lead frames 1, by common movement of the frames supporting the lead frame transfer conveyor 2 without a separate driving source. The present finishing width adjusting device has a simple structure and can be made at low cost. Maintenance is easy. Manual operations to change the effective width of the finishing tools are eliminated, which would otherwise be necessary each time the lead frame width is changed. Accordingly, operational efficiency is greatly increased and quality control becomes easier. The object of this invention, to offer a useful lead frame finishing machine and shop practice, is fulfilled.

Although a particular preferred embodiment of the invention has been disclosed in detail for illustrative purpose, it will be recognized that variations or modifications of the disclosed apparatus, including the rearrangement of parts, lie within the scope of the present invention.

The embodiments of the invention in which an exclusive property or privilege is claimed are defined as follows:

1. A lead frame finishing apparatus which comprises a tool supporting base on which a plurality of lead frame finishing tools are provided; two frames supporting a lead frame transfer means, which transfer means clamps the lead frames at their edges and has an adjustable width; linkage means which connects at least one of the frames to the tool supporting base and moves said tool supporting base to correspond the effective width covered by said tools to the width between the two frames which support the lead frame transfer means.

2. The apparatus of claim 1 in which the transfer means comprise endless conveyors with opposed reaches carrying clamp means for gripping opposite edges of successive lead frames, said frames each supporting a corresponding one of said endless conveyors, motor driven screw means actuable to shift said frames and hence said endless conveyors toward and away from each other to correspond to different width lead frames to be conveyed.

3. The apparatus of claim 1 including means supporting said frames for adjustment toward and away from each other to correspond to different width lead frames to be conveyed, said linkage means comprising an arm fixed to one said frame and bracket means protruding from said tool support base and an elongate link having opposite ends pivotally connected to said arm and bracket means such that movement of said frames moves said tool support base.

4. The apparatus of claim 1 including a fixed machine frame defining a path along which lead frames are conveyed by said lead frame transfer means, said frames being adjustable with respect to said machine frame toward and away from said path, a base plate fixed with respect to said machine frame and facing said lead frames conveyed along said path, said tool support base being supported pivotally on said base plate, said linkage means including an elongate link connected pivotably to a said frame and to said tool support base such that relative movement of said frames correspondingly pivots said tool support base on said base plate.

5. The apparatus of claim 4 in which said base plate has a window through which said tools aim at said lead frames on said path.

6. The apparatus of claim 5 including a bracket extending through said window from said tool support base to pivotally engage said link.

7. The apparatus of claim 4 in which said tools are spaced along a line past the pivot axis of said tool support base, a pivot pin sealed and fixed to said base plate, bearing means on said tool support base rotatably supported on said pin and means sealing the side of said tool support base against contamination of said pin.

8. The apparatus of claim 4 in which said link includes a turnbuckle actuable for adjusting the length of said link.

9. The apparatus of claim 1 including upper and lower base plates respectively above and below said transfer means and facing lead frames on said transfer means, said upper and lower base plates being offset along the path of said lead frames carried by said transfer means, a fixed machine frame, said base plates being fixed with respect to said machine frame, two said tool support bases being carried on outboard faces of respective base plates, said base plates each having windows through which tools on said tool support bases aim toward said lead frames, one said frame having upper and lower arms fixed thereon, said linkage means comprising two elongate links pivotably connected at one end of each thereof to respective arms and at the other end to each thereof to respective tool support bases, such that movement of said frame adjusts the effective finishing width of said tools.

10. The apparatus of claim 9 in which said transfer means is disposed between said frames, and including arms extending outboard from one said frame away from said lead frames, said links extending back over said transfer means.

11. The apparatus of claim 1 in which said tool support base carries an array of tools spaced along a line, said tool support base being pivoted on a pivot axis centered on said array of tools, said linkage means being pivotably connected to said tool support base adjacent one end of said array and remote from said pivot axis, said array of tools having a minimum width position in which said array line thereof is parallel to the path of advance of said lead frames, said array of tools having a maximum width position in which said array line thereof forms an acute angle to said path of advance.

12. The apparatus of claim 11 in which said maximum acute angle is about 6°.

* * * * *